(12) United States Patent
Abe

(10) Patent No.: US 12,010,887 B2
(45) Date of Patent: *Jun. 11, 2024

(54) SEMICONDUCTOR UNIT, METHOD OF MANUFACTURING THE SAME, AND ELECTRONIC APPARATUS

(71) Applicant: Sony Group Corporation, Tokyo (JP)

(72) Inventor: Hironobu Abe, Kanagawa (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/682,007

(22) Filed: Feb. 28, 2022

(65) Prior Publication Data

US 2022/0181430 A1 Jun. 9, 2022

Related U.S. Application Data

(63) Continuation of application No. 16/820,355, filed on Mar. 16, 2020, now Pat. No. 11,302,766, which is a (Continued)

(30) Foreign Application Priority Data

Feb. 6, 2012 (JP) .................... 2012-023315

(51) Int. Cl.
*H10K 59/131* (2023.01)
*G02F 1/1345* (2006.01)
*H01L 23/48* (2006.01)
*H01L 27/12* (2006.01)
*H01L 33/62* (2010.01)
(Continued)

(52) U.S. Cl.
CPC ....... *H10K 59/131* (2023.02); *G02F 1/13452* (2013.01); *H01L 23/48* (2013.01); *H01L 33/62* (2013.01); *H05K 1/0271* (2013.01); *H05K 3/36* (2013.01); *H05K 3/361* (2013.01); *H10K 77/111* (2023.02); *H01L 27/1218* (2013.01); *H05K 3/323* (2013.01); *H05K 2201/10136* (2013.01)

(58) Field of Classification Search
CPC .......... H01L 33/62; H01L 23/48; H05K 3/36; H05K 3/361; H05K 3/323; G02F 1/13452; H10K 59/131; H10K 77/111
USPC ....................................... 257/301
See application file for complete search history.

(56) References Cited

U.S. PATENT DOCUMENTS 5,067,796 A * 11/1991 Suzuki ............. G02F 1/13452
349/149
5,436,744 A 7/1995 Arledge et al.
(Continued)

FOREIGN PATENT DOCUMENTS

JP 2011-108780 6/2011
WO WO 2014/080604 5/2014

*Primary Examiner* — Igwe U Anya
(74) *Attorney, Agent, or Firm* — SHERIDAN ROSS P.C.

(57) ABSTRACT

There are provided a semiconductor unit that prevents connection failure caused by a wiring substrate to improve reliability, a method of manufacturing the semiconductor unit, and an electronic apparatus including the semiconductor unit. The semiconductor unit includes: a device substrate including a functional device and an electrode; a first wiring substrate electrically connected to the functional device through the electrode; and a second wiring substrate electrically connected to the functional device through the first wiring substrate.

20 Claims, 19 Drawing Sheets

Related U.S. Application Data continuation of application No. 16/108,492, filed on Aug. 22, 2018, now Pat. No. 10,629,669, which is a continuation of application No. 15/597,869, filed on May 17, 2017, now Pat. No. 10,096,670, which is a continuation of application No. 14/939,277, filed on Nov. 12, 2015, now Pat. No. 9,698,209, which is a continuation of application No. 13/753,268, filed on Jan. 29, 2013, now Pat. No. 9,219,207.

(51) Int. Cl.
*H05K 1/02* (2006.01)
*H05K 3/36* (2006.01)
*H10K 77/10* (2023.01)
*H05K 3/32* (2006.01)

(56) References Cited

U.S. PATENT DOCUMENTS

| | | | |
|---|---|---|---|
| 6,867,496 B1 | 3/2005 | Hashimoto | |
| 7,439,540 B2 | 10/2008 | Chang et al. | |
| 9,219,207 B2 * | 12/2015 | Abe | H05K 3/361 |
| 9,698,209 B2 | 7/2017 | Abe | |
| 10,096,670 B2 | 10/2018 | Abe | |
| 10,629,669 B2 | 4/2020 | Abe | |
| 2004/0189926 A1 | 9/2004 | Yamaji et al. | |
| 2006/0193117 A1 * | 8/2006 | Miyata | G02F 1/13452 349/60 |
| 2007/0035473 A1 | 2/2007 | Yamazaki et al. | |
| 2009/0039495 A1 | 2/2009 | Yamashita et al. | |
| 2010/0026952 A1 | 2/2010 | Miura et al. | |
| 2010/0321318 A1 | 12/2010 | Oohira | |
| 2011/0007042 A1 | 1/2011 | Miyaguchi | |
| 2011/0068444 A1 | 3/2011 | Chi et al. | |
| 2011/0134621 A1 * | 6/2011 | Saimen | G02F 1/13452 361/748 |
| 2011/0157512 A1 * | 6/2011 | Mishima | G02B 6/0068 349/58 |
| 2011/0195532 A1 | 8/2011 | Lerman et al. | |
| 2011/0228196 A1 | 9/2011 | Kubota et al. | |
| 2012/0133876 A1 | 5/2012 | Nakahama et al. | |
| 2012/0235948 A1 | 9/2012 | Inoue et al. | |
| 2012/0257361 A1 | 10/2012 | Nishi | |
| 2020/0219963 A1 | 7/2020 | Abe | |

* cited by examiner

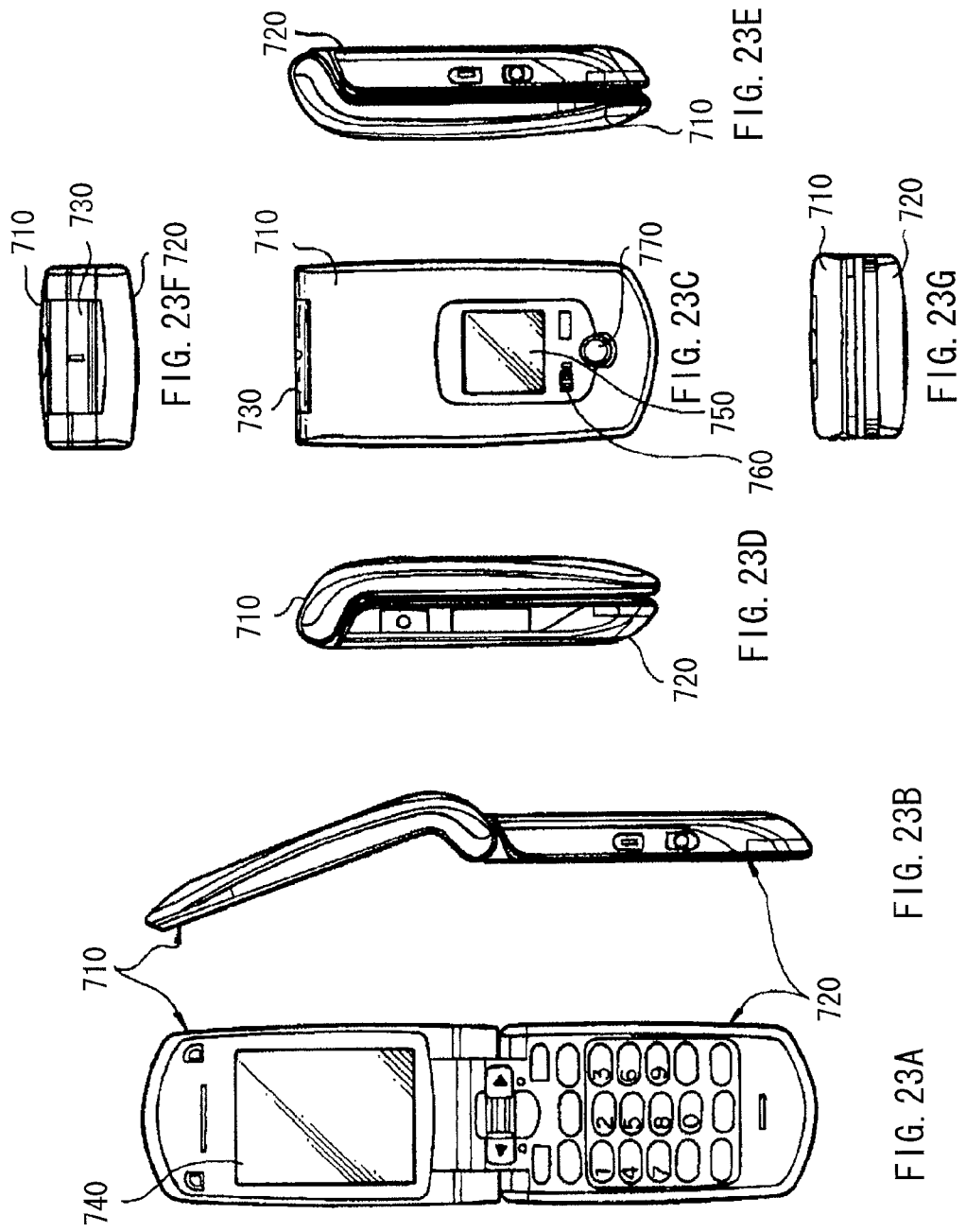

SEMICONDUCTOR UNIT, METHOD OF MANUFACTURING THE SAME, AND ELECTRONIC APPARATUS

CROSS-REFERENCE TO RELATED APPLICATIONS

This application is a continuation of U.S. patent application Ser. No. 16/820,355 filed Mar. 16, 2020, which is a continuation of U.S. patent application Ser. No. 16/108,492 filed Aug. 22, 2018, now U.S. Pat. No. 10,629,669, which is a continuation of U.S. patent application Ser. No. 15/597,869 filed May 17, 2017, now U.S. Pat. No. 10,096,670, which is a continuation of U.S. patent application Ser. No. 14/939,277 filed Nov. 12, 2015, now U.S. Pat. No. 9,698,209, which is a continuation of U.S. patent application Ser. No. 13/753,268 filed Jan. 29, 2013, now U.S. Pat. No. 9,219,207, which claims priority to Japanese Patent Application No. JP 2012-023315, filed in the Japan Patent Office on Feb. 6, 2012, the entire disclosures of which are hereby incorporated herein by reference.

BACKGROUND

The present disclosure relates to a semiconductor unit in which a device substrate provided with functional devices such as display devices is connected to a wiring substrate for external connection, a method of manufacturing the semiconductor unit, and an electronic apparatus including the semiconductor unit.

In a display including a plurality of display devices on a device substrate, electrodes for external connection are provided in a peripheral region of the device substrate, and the electrodes are connected to a wiring substrate. The wiring substrate is connected to a drive circuit such as a driver IC, and external signals are transmitted to the display devices.

In recent years, to address increased demand for displays in terms of reduction in thickness and frame width, and design, a method in which a flexible wiring substrate is used as a wiring substrate, and the flexible wiring substrate is folded along an outer shape of a device substrate, and thus is contained in a housing, is often used (for example, Japanese Unexamined Patent Application Publication No. 2011-108780). A drive circuit connected to the wiring substrate is disposed on a back surface side of the device substrate. When a flexible material is used for the device substrate of the display, a flexible display is realizable.

SUMMARY

However, in the folded wiring substrate, stress to return back the folding, that is, spring back occurs. Accordingly, connection failure such as detachment of bonding between the wiring substrate and the device substrate, and breaking or short circuit of the wirings of the wiring substrate may occur. In particular, the device substrate used for a flexible display is thin, and the wiring substrate is folded with a large curvature. Therefore, in the flexible display, spring back is increased and connection failure is more likely to occur.

It is desirable to provide a semiconductor unit that prevents connection failure caused by a wiring substrate to improve reliability, a method of manufacturing the semiconductor unit, and an electronic apparatus including the semiconductor unit.

According to an embodiment of the technology, there is provided a semiconductor unit including: a device substrate including a functional device and an electrode; a first wiring substrate electrically connected to the functional device through the electrode; and a second wiring substrate electrically connected to the functional device through the first wiring substrate.

According to an embodiment of the technology, there is provided an electronic unit including a semiconductor unit. The semiconductor unit includes: a device substrate including a functional device and an electrode; a first wiring substrate electrically connected to the functional device through the electrode; and a second wiring substrate electrically connected to the functional device through the first wiring substrate.

In the semiconductor unit or the electronic apparatus of the embodiment of the technology, signal transmission between the functional device and external circuits (for example, a drive circuit) is performed through two wiring substrates, namely, the second wiring substrate and the first wiring substrate.

According to an embodiment of the technology, there is provided a method of manufacturing a semiconductor unit. The method includes: forming a device substrate including a functional device and an electrode, the electrode being electrically connected to the functional device; and electrically connecting a first wiring substrate to the electrode and to a second wiring substrate.

In the semiconductor unit, the method of manufacturing the same, and the electronic apparatus according to the embodiments of the technology, signal transmission between the functional device and external circuits is performed using the two wiring substrate. Therefore, the first wiring substrate is allowed to be disposed on the front surface side of the device substrate, and the second wiring substrate is allowed to be disposed on the back surface side of the device substrate. Consequently, signals are allowed to be transmitted between the external circuits on the back surface side of the device substrate and the functional device on the front surface side without the wiring substrates being folded, and thus connection failure on the wiring substrate is prevented to improve reliability.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 23A is a front view of an application example 6 in an open state, FIG. 23B is a side view thereof, FIG. 23C is a front view in a closed state, FIG. 23D is a left side view, FIG. 23E is a right side view, FIG. 23F is a top view, and FIG. 23G is a bottom view.

DETAILED DESCRIPTION

Hereinafter, a preferred embodiment of the technology will be described in detail with reference to drawings. Note that the description is given in the following order.

1. Embodiment

A display in which external signals are transmitted through a first wiring substrate and a second wiring substrate

2. Modification 1

A display including wirings on both surfaces of a second wiring substrate

3. Modification 2

A display including a first drive circuit and a second drive circuit that are intended to drive display devices and collectively provided on one side of a device substrate

Embodiment

Figure 1:
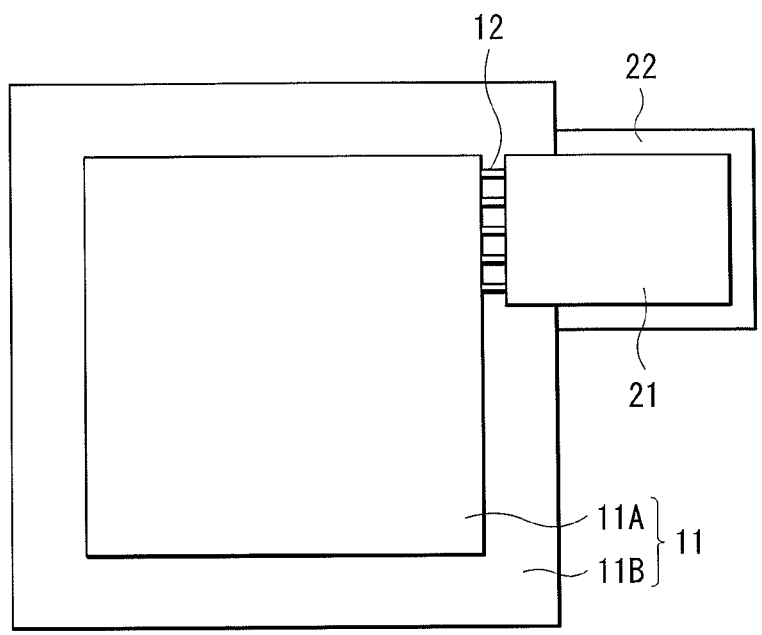
FIG. 1 is a plan view illustrating a configuration of a main part of a display according to an embodiment of the disclosure.
Figure 1:
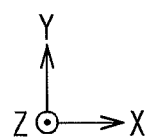
Figure 2:
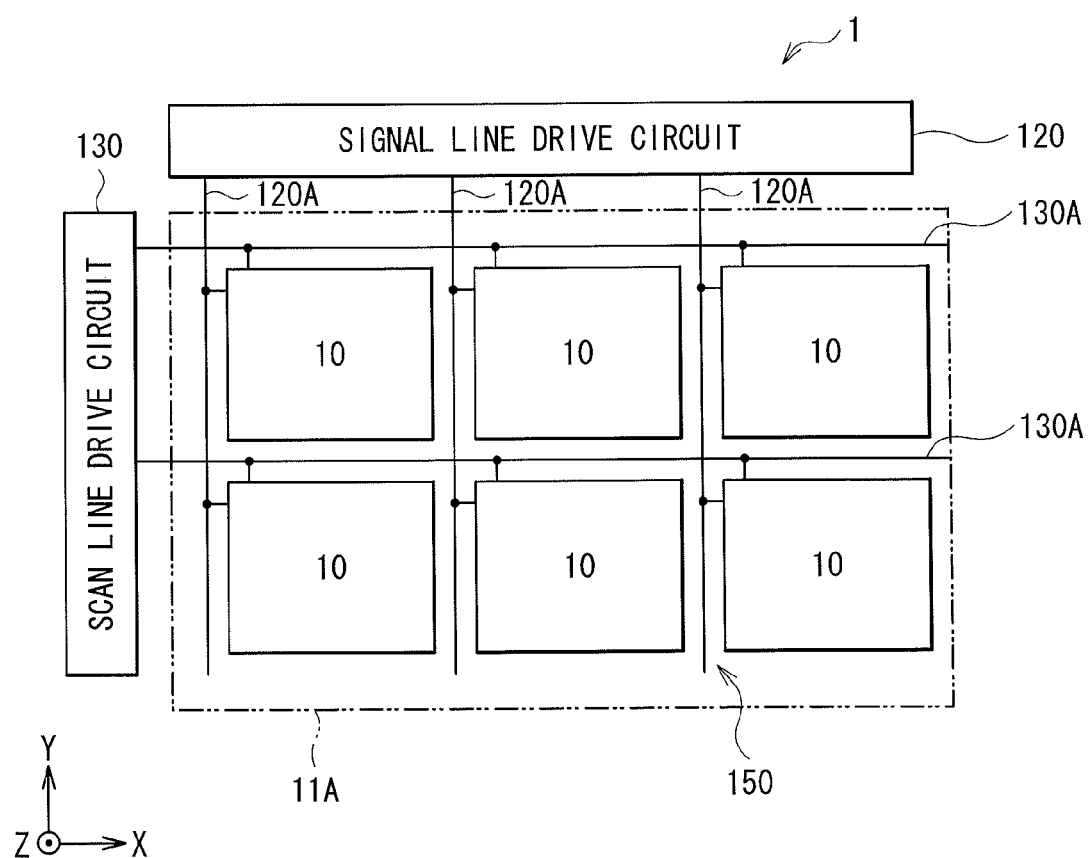
FIG. 2 is a diagram illustrating an entire configuration of the display illustrated in FIG. 1.

FIG. 1 illustrates a planar configuration of a main part of a display (a display 1) according to an embodiment of the technology. FIG. 2 illustrates an entire configuration of the display 1. The display 1 is a flexible display using a flexible substrate for a device substrate 11, and is deformable through, for example, warping, rolling, folding, and the like. A plurality of display devices 10 (functional devices) that is two-dimensionally arranged in a matrix is provided in a display region 11A at a center (of a surface) on the device substrate 11. For example, a signal line drive circuit 120 and a scan line drive circuit 130 that are drivers for image display are provided in a peripheral region 11B surrounding the display region 11A. Drive signals (external signals) from one or both of the signal line drive circuit 120 and the scan line drive circuit 130 are transmitted to the display devices 10 through a second wiring substrate 22, a first wiring substrate 21, and electrodes 12. Herein, the description is given on the assumption that the scan line drive circuit 130 is connected to the second wiring substrate 22 and the like. Note that FIG. 1 schematically illustrates the configuration of the display 1, and an actual size and an actual shape are not necessary to be the size and the shape described herein.

The display region 11A is provided with display devices 10 and a pixel drive circuit 150 driving the display devices 10. In the pixel drive circuit 150, a plurality of signal lines 120A (120A1, 120A2, . . . , 120Am, . . . ) is arranged in a column direction (Y direction), and a plurality of scan lines 130A (130A1, . . . , 130An, . . . ) is arranged in a row direction (X direction). The display device 10 is provided in each intersection between the signal lines 120A and the scan lines 130A. Both ends of each of the signal lines 120A are connected to the signal line drive circuit 120, and both ends of each of the scan lines 130A are connected to the scan line drive circuit 130.

The signal line drive circuit 120 supplies the display devices 10, which are selected through the signal lines 120A, with a signal voltage of an image signal according to luminance information supplied from a signal supply source (not illustrated). The signal voltage from the signal line drive circuit 120 is applied to both ends of each of the signal lines 120A.

The scan line drive circuit 130 is configured of a shift resistor and the like. The shift resistor sequentially shifts (transfers) a start pulse in synchronization with an input clock pulse. The scan line drive circuit 130 scans, on a row basis, the image signals that are written into the display devices 10, and sequentially supplies the scan signals to each of the scan lines 130A. The both ends of each of the scan lines 130A are supplied with scan signals from the scan line drive circuit 130. In other words, the electrode 12 is an electrode electrically connected to each of the scan lines 130A in the peripheral region 11B.

Figure 3:
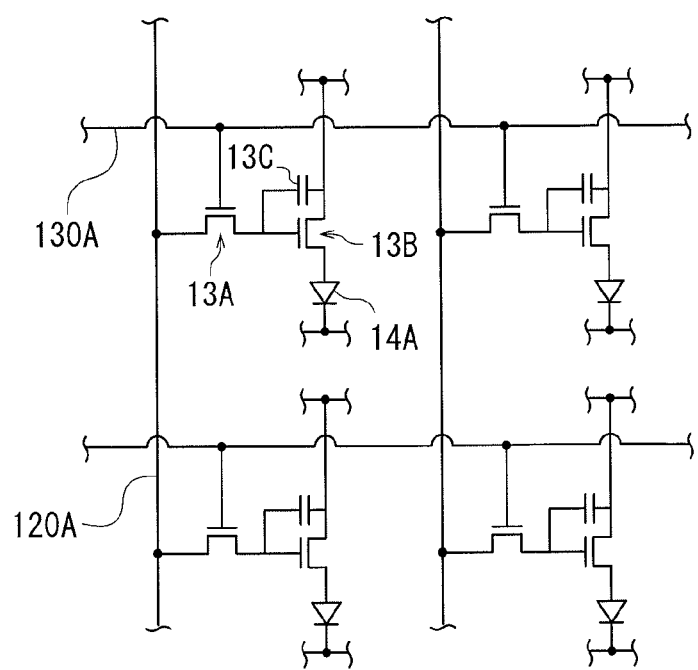
FIG. 3 is a circuit diagram illustrating a configuration of a pixel drive circuit illustrated in FIG. 2.

FIG. 3 illustrates a configuration example of the pixel drive circuit 150. The pixel drive circuit 150 is an active drive circuit including thin film transistors (TFTs) 13A for selection of the display devices 10, TFTs 13B for driving of the display devices 10, capacitors (retention capacitors) 13C, and devices 14A for a display layer (a display layer 14 described later). In this circuit, the selection TFTs 13A, the drive TFTs 13B, the devices 14A, and the capacitors 13C are provided in positions where the signal lines 120A and the scan lines 130A intersect to each other. In the display 1, for example, the electrode 12 is connected to a gate electrode of the selection TFT 13A through each of the scan lines 130A. Connection destinations of source-drain electrodes and a gate electrode of each of the selection TFT 13A and the drive TFT 13B are not limited to those illustrated in FIG. 3, and may be appropriately changed.

Figure 4:
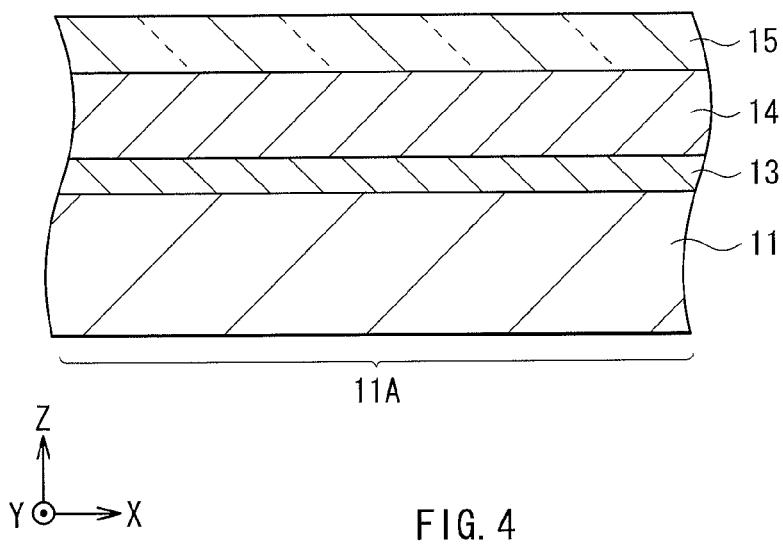
FIG. 4 is a sectional diagram illustrating a configuration of a display region illustrated in FIG. 1.

As illustrated in FIG. 4, in the display region 11A, a TFT layer 13 including the selection TFTs 13A and the drive TFTs 13B, the display layer 14, and a counter substrate 15 are provided in this order on a front surface (a first surface) of the device substrate 11. In the display 1, an image is displayed on a counter substrate 15 side.

The device substrate 11 has, for example, a rectangular shape, and is configured of a flexible material with a thickness (a thickness in a Z-axis direction, hereinafter, simply referred to as a thickness) of about 10 μm to about 100 μm. Specifically, the device substrate 11 is configured of a film that is formed of polyethylene terephthalate, polyethylene naphthalate, polyether sulfone, polyetherimide, polyetherether ketone, polyphenylene sulfide, polyarylate, polyimide, polyamide, polycarbonate, cellulose triacetate, polyolefin, polystyrene, polyethylene, polypropylene, polymethyl methacrylate, polyvinyl chloride, polyvinylidene chloride, an epoxy resin, a phenol resin, a urea resin, a melamine resin, a silicone resin, an acrylic resin, or the like, a metal foil, or the like. A thin-layer glass, a thin-layer ceramics, and the like that are reduced in thickness to the extent of showing flexibility may be used. The device substrate 11 has a front surface, a back surface (a second surface) opposing to the front surface, and a side surface (a third surface) connecting the front surface and the back surface.

To prevent deterioration of the TFT layer 13 and the display layer 14 due to moisture or an organic gas, a barrier layer (not illustrated) may be provided between the device substrate 11 and the TFT layer 13. The barrier layer is formed of, for example, $AlO_xN_{1-x}$ (where X=0.01 to 0.2) or silicon nitride ($Si_3N_4$).

The TFT layer 13 has a function as a switching device for selecting a pixel, and includes a capacitor 13C, wirings of the pixel drive circuit 150 (the signal lines 120A, the scan lines 130A, and the like), in addition to the selection TFTs 13A and the drive TFTs 13B, each of which has a gate electrode, a channel layer, and source-drain electrodes. Each of the selection TFTs 13A and the drive TFTs 13B may be an inorganic TFT configured using an inorganic semiconductor layer as the channel layer, or may be an organic TFT configured using an organic semiconductor layer as the channel layer.

The display layer 14 is configured of a plurality of devices 14A, and includes, for example, pixel electrodes provided for each of the devices 14A, a common electrode common to the devices 14A, and a liquid crystal layer, an organic electroluminescence (EL) layer, an inorganic EL layer, an electrophoretic display element, or the like between the pixel electrodes and the common electrode.

The counter substrate 15 may be formed of a similar material to that of the above-described device substrate 11. A damp-proof film to prevent infiltration of moisture to the display layer 14, and an optical functional film such as an antireflection film may be provided on the counter substrate 15.

Figure 5A:
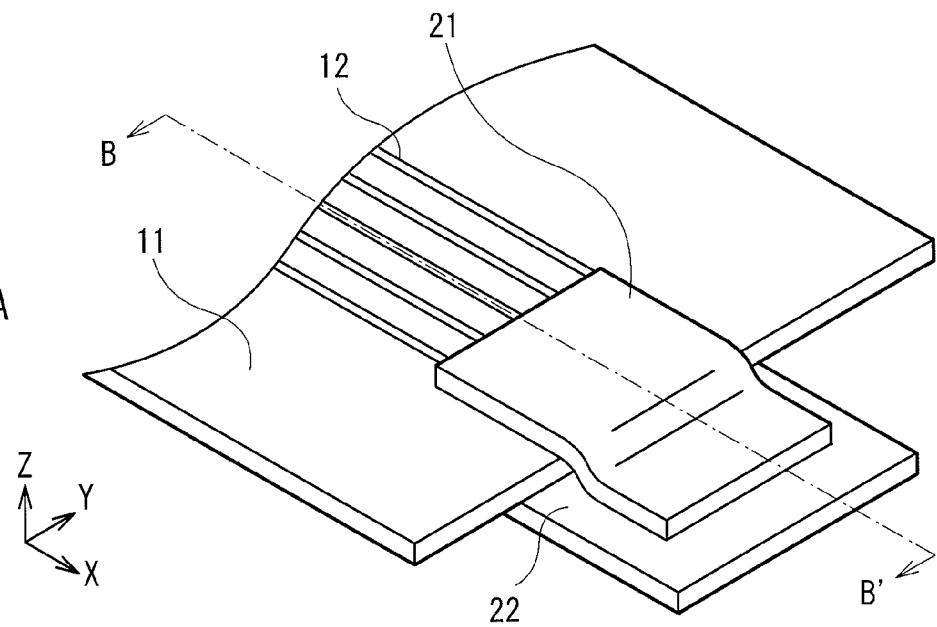
FIGS. 5A and 5B are diagrams each illustrating configurations of a first wiring substrate and a second wiring substrate illustrated in FIG. 1.
Figure 5B:
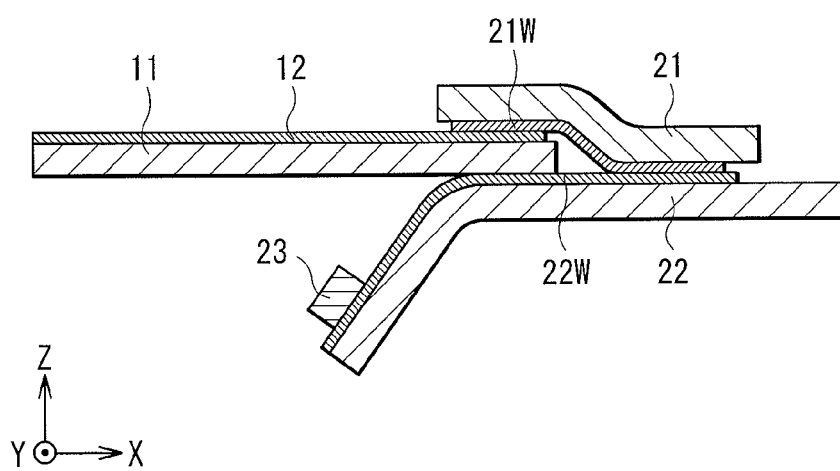

The electrodes 12 electrically connected to the display devices 10 are exposed in the peripheral region 11B of the front surface of the device substrate 11. In the embodiment, as illustrated in FIGS. 5A and 5B, the first wiring substrate 21 is connected to the electrode 12, and is further connected to the second wiring substrate 22 including the driver IC 23 mounted thereon. Accordingly, external signals are transmitted to the display devices 10 without the wiring substrates being folded. FIG. 5A is a perspective view illustrating a state where the device substrate 11, the first wiring substrate 21, and the second wiring substrate are connected to one another, and FIG. 5B is a sectional view taken along a B-B' line of FIG. 5A.

Figure 6A:
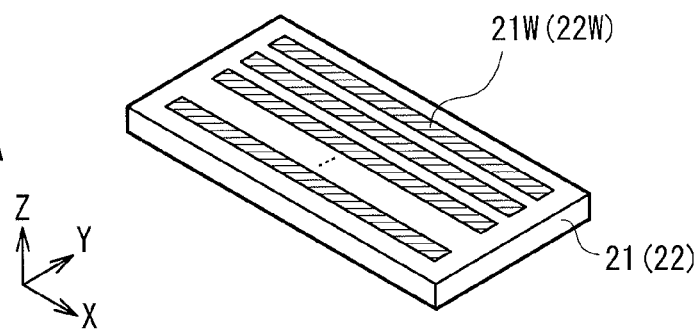
FIGS. 6A and 6B are perspective views each illustrating the configurations of the first wiring substrate and the second wiring substrate illustrated in FIGS. 5A and 5B.

As illustrated in FIG. 6A, the first wiring substrate 21 and the second wiring substrate 22 are flexible wiring substrates each provided with wirings (first wirings 21W or second wirings 22W) on one surface of a flexible base material formed of, for example, polyimide film. Although wirings may be formed on both surfaces of the base material as a second wiring substrate 42 described later, provision of the wirings on one surface facilitates the processes of manufacturing the first wiring substrate 21 and the second wiring substrate 22. Moreover, compared with the case where the wirings are provided on both surfaces, the thickness of the wiring substrate is allowed to be reduced. The first wiring substrate 21 and the second wiring substrate 22 each have a thickness of, for example, about several tens μm.

Figure 6B:
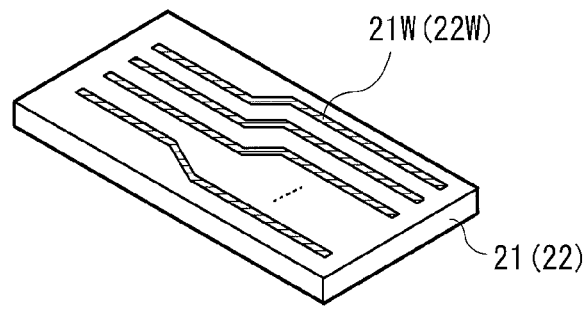

A pitch (a distance between wirings) of each of the first wirings 21W and the second wirings 22W may be constant (FIG. 6A), or may be different between in a region close to one end and in a region close to the other end as illustrated in FIG. 6B. For example, when the pitch of the electrodes 12 and the pitch of the second wirings 22W are different from each other, the difference between the pitches may be adjust in the first wirings 21W. In other words, the pitch of the second wirings 22W is increased, and thus manufacturing of the second wiring substrate 22 is facilitated.

The first wiring substrate 21 is provided on a front surface side of the device substrate 11, and the second wiring substrate 22 is provided on a back surface side of the device substrate 11. The first wiring substrate 21 and the second wiring substrate 22 are in contact with each other on the outside of the device substrate 11 (FIGS. 5A and 5B). Specifically, a region close to one end of the first wiring substrate 21 and a region close to one end of the second wiring substrate 22 in the extending (X-axis) direction are overlapped with the device substrate 11, and a region close to the other end of the first wiring substrate 21 and a region close to the other end of the second wiring substrate 22 are exposed to the outside.

The region close to the one end of the first wiring substrate 21 is bonded to an end of the front surface of the device substrate 11, and the region close to the other end is flared to the outside of the device substrate 11 to cover the side surface (the third surface). The first wirings 21W of the first wiring substrate 21 are provided to face the electrodes 12 on the front surface of the device substrate 11, and are in contact with and electrically connected to the electrodes 12.

The second wiring substrate 22 is bonded to the end of the back surface of the device substrate 11, and the region close to the other end is flared to the outside of the device substrate 11 while maintaining a planar state. In other words, the first wiring substrate 21 and the second wiring substrate 22 are in contact with each other on the back surface side of the device substrate 11. The first wiring substrate 21 and the second wiring substrate 22 are flared to the outside of the device substrate 11 by the extent that electrical connection between the first wiring substrate 21 and the second wiring substrate 22 are ensured. The second wiring substrate 22 has a width (in the Y-axis direction) larger than that of the first wiring substrate 21, for example. In addition, the second wiring substrate 22 is disposed so that the end surface thereof is flared to the outer side of the device substrate 11 than that of the first wiring substrate 21.

The second wirings 22W of the second wiring substrate 22 are provided to face the first wirings 21W, and are in contact with and electrically connected to the first wirings 21W on the outside of the device substrate 11. In other words, the first wirings 21W located in a region close to one end (on the inside of the device substrate 11) face the electrodes 12, and the first wirings 21W located in a region close to the other end (on the outside of the device substrate 11) face the second wirings 22W. The driver IC 23 (the first drive circuit) is provided on the second wirings 22W located in a region close to one end (on the inside of the device substrate 11). In other words, a gap for the driver IC 23 is provided between the second wiring substrate 22 and the device substrate 11. The driver IC 23 supplies external signals, for example, scan signals to the display devices 10.

The first wirings 21W are connected to the electrodes 12 and to the second wirings 22W through thermal compression bonding with, for example, an anisotropic conductive sheet (not illustrated) therebetween. The thermal compression bonding enables electrical connection and bonding. The anisotropic conductive sheet is obtained by dispersing particles into an adhesive layer formed of a resin or the like. The particles are metal fine particles or resin particles coated with a metal. The anisotropic conductive sheet is provided between the first wirings 21W and the electrodes 12, and between the first wirings 21W and the second wirings 22W, and then thermal compression bonding is performed. Thus, metal fine particles or the like are in contact with the first wirings 21W, the electrodes 12, and the second wirings 22W to make electrical connection. In addition, the adhesive layer in the anisotropic conductive sheet is cured so that the first wiring substrate 21 is bonded and fixed to the device substrate 11 and to the second wiring substrate 22.

Figure 7:
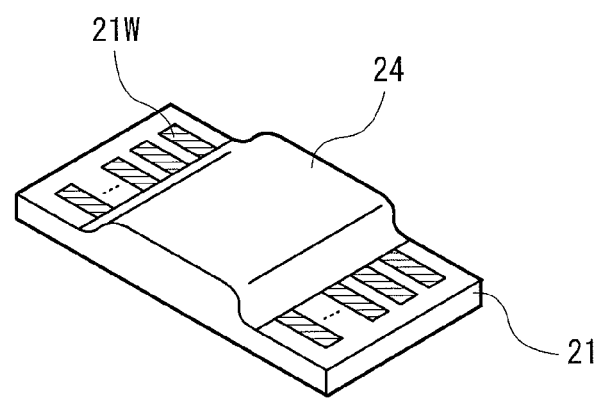
FIG. 7 is a perspective view illustrating a modification of the first wiring substrate illustrated in FIGS. 6A and 6B.

As illustrated in FIG. 7, a protective portion 24 covering a part of the first wirings 21W, for example, a center portion of the first wirings 21W, may be provided on the first wiring substrate 21. The protective portion 24 prevents breakage of the first wirings 21W when the electrodes 12 and the first wirings 21W are connected. When the first wiring substrate 21 is provided in a region from the front surface to the side surface of the device substrate 11, a part of the first wiring substrate 21 faces a corner configured of the front surface and the side surface of the device substrate 11. The protective portion 24 is provided in a portion facing the corner to prevent damage of the first wirings 21W. The protective portion 24 is formed of, for example, an acrylic film, a urethane film, an imide film, or photosolder resist. The protective portion 24 may be provided on the second wiring substrate 22. In addition, instead of provision of the protective portion 24, chamfer treatment of the corner of the device substrate 11 prevents damage of the first wirings 21W.

The display 1 is manufactured in the following way, for example.

First, the above-described TFT layer 13 is formed in the display region 11A of the device substrate 11. At the same time of formation of the wirings and the electrodes of the TFT layer 13, the electrodes 12 are formed in the peripheral region 11B. Next, the display layer 14 and the counter substrate 15 are formed on the TFT layer 13. Consequently, the device substrate 11 including the display devices 10 and the electrodes 12 on the front surface thereof is formed.

Figure 8A:
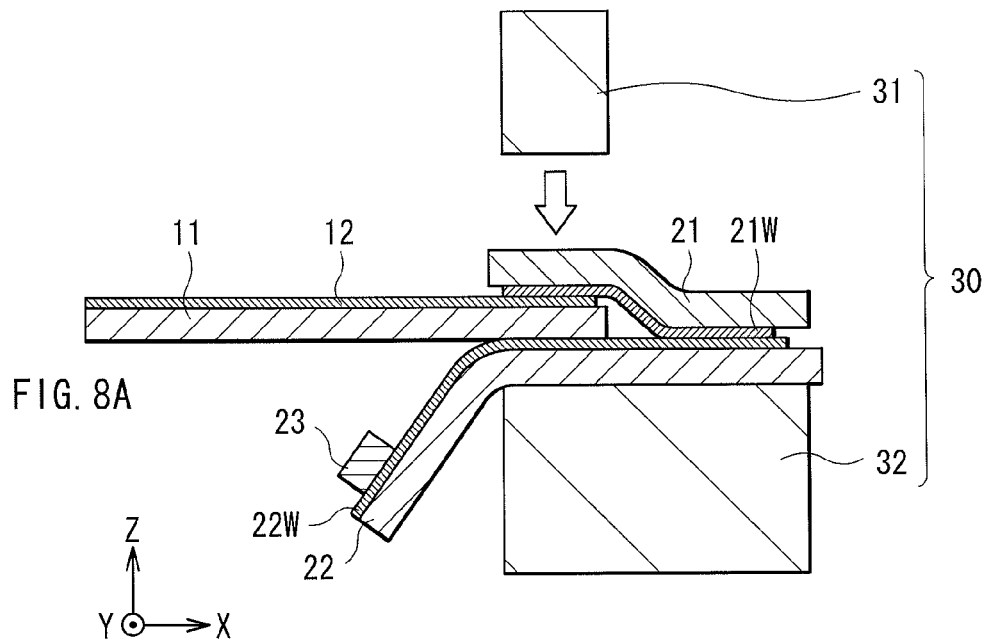
FIGS. 8A and 8B are sectional diagrams each illustrating a process in a method of manufacturing the display illustrated in FIG. 1.
Figure 8B:
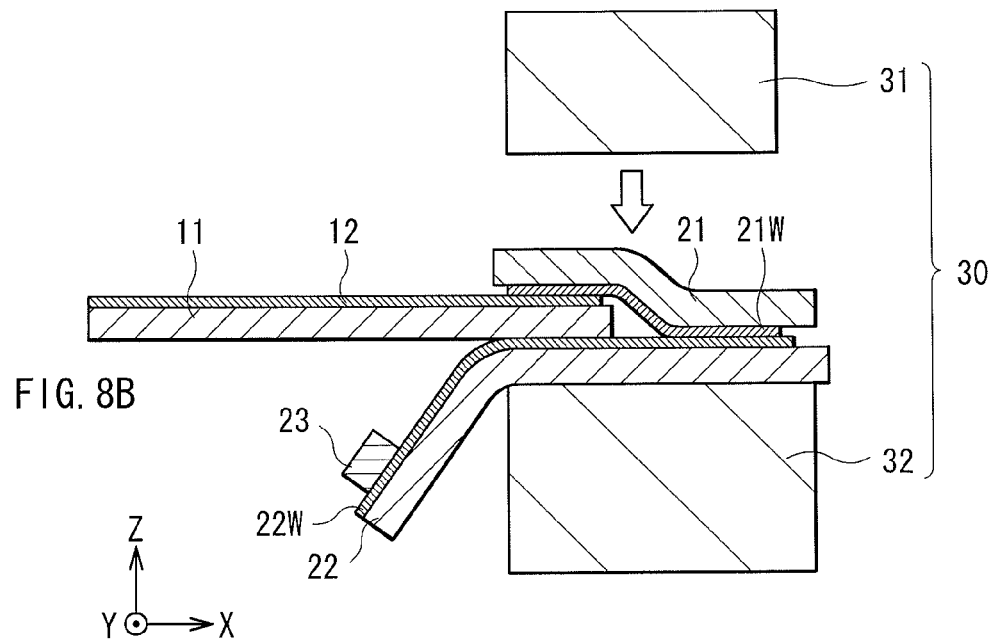

Subsequently, the first wiring substrate 21 is connected to the device substrate 11 (the electrodes 12) and to the second wiring substrate 22 using anisotropic conductive sheets through thermal compression bonding. The processes of the thermal compression bonding are performed with use of a thermal compression bonding apparatus 30 including two heads (an upper head 31 and a lower head 32), as illustrated in FIGS. 8A and 8B, for example. First, the anisotropic conductive sheet (not illustrated) is provided between the first wiring substrate 21 and the device substrate 11 and between the first wiring substrate 21 and the second wiring substrate 22, and then the first wiring substrate 21, the device substrate 11, and the second wiring substrate 22 are sandwiched between the upper head 31 and the lower head 32. Then, when the upper head 31 and the lower head 32 are heated, the first wiring substrate 21, the device substrate 11, the second wiring substrate 22, and the anisotropic conductive sheets are heated, and thus, electrical connection and bonding are performed therebetween. As illustrated in FIG. 8A, in the processes of the thermal compression bonding, with use of the small upper head 31, connection between the first wiring substrate 21 and the device substrate 11 may be performed separately from connection between the first wiring substrate 21 and the second wiring substrate 22. Alternatively, as illustrated in FIG. 8B, with use of the large upper head 31, both the connections may be performed at the same time. In the case where there is less possibility that the first wirings 21W and the second wirings 22W are damaged by the corner of the device substrate 11 or the like, both the connections are favorably performed at the same time because manufacturing processes are allowed to be reduced. For example, when the device substrate 11 is soft, the thermal compression bonding between the first wiring substrate 21 and the device substrate 11 may be performed at the same time of the thermal compression bonding between the first wiring substrate 21 and the second wiring substrate 22. When the connection between the first wiring substrate 21 and the device substrate 11 is performed separately from the connection between the first wiring substrate 21 and the second wiring substrate 22, connection with a small pitch, for example, the connection between the first wiring substrate 21 and the device substrate 11 is favorably performed first.

Moreover, in the processes of the thermal compression bonding, when a thermosetting adhesive layer is provided between the device substrate 11 and the second wiring substrate 22, the second wiring substrate 22 is allowed to be fixed to the device substrate 11 in the same process. The device substrate 11, the first wiring substrate 21, and the second wiring substrate 22 are contacted as close as possible to improve flexibility of the display 1.

Figure 9:
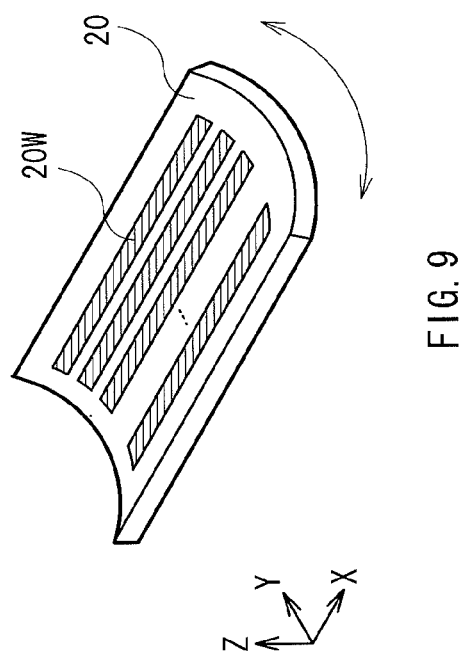
FIG. 9 is a perspective view for explaining curl generated in a flexible wiring substrate.
Figure 10:
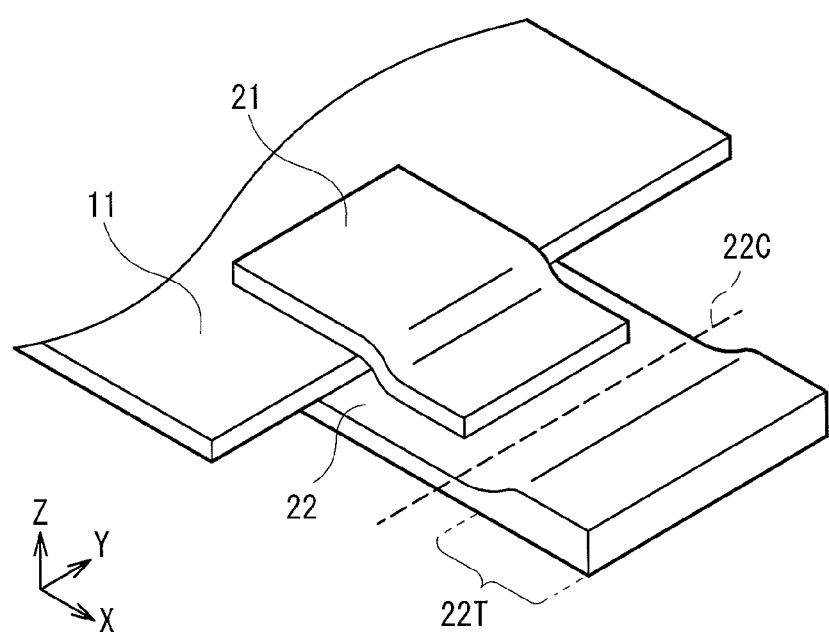
FIG. 10 is a perspective view illustrating another modification of the first wiring substrate and the second wiring substrate illustrated in FIGS. 5A and 5B.

To prevent curl of the first wiring substrate 21 and the second wiring substrate 22, the thermal compression bonding may be performed in a state where the end of each of the first wiring substrate 21 and the second wiring substrate 22 is increased in thickness. As illustrated in FIG. 9, when a wiring substrate (a wiring substrate 20) is decreased in thickness, shape stability is decreased and curl (for example, in an arrow direction of FIG. 9) easily occurs. The curl of the wiring substrate 20 may inhibit the processes of the above-described thermal compression bonding. For example, there are conceivable disadvantages that, for example, the wiring substrate 20 is not allowed to be held in vacuum contact by the thermal compression bonding apparatus 30, and the wiring substrate 20 is dropped off from the thermal compression bonding apparatus 30 (the upper head 31 and the lower head 32) during the processes of the thermal compression bonding. Then, as illustrated in FIG. 10, a thick film portion 22T is provided on the end of the second wiring substrate 22, thereby preventing the curl of the second wiring substrate 22. The thick film portion 22T is provided on the other end (on the outside of the device substrate 11) of the second wiring substrate 22, and has a thickness larger than that of the other portions by about 50 µm, for example. The thick film portion 22T may be formed by stacking the similar material to the protective portion 24, such as an acrylic film, a urethane film, an imide film, and photo solder resist. In addition, the thick film portion 22T may be configured of a dummy electrode. With such a thick film portion 22T, processes of the thermal compression bonding is allowed to be performed smoothly. Although the thick film portion 22T may be remained, the thick film portion 22T is cut out along a cut line 22C after thermal compression bonding so that the second wiring substrate 22 with uniform thickness is obtainable.

Figure 11A:
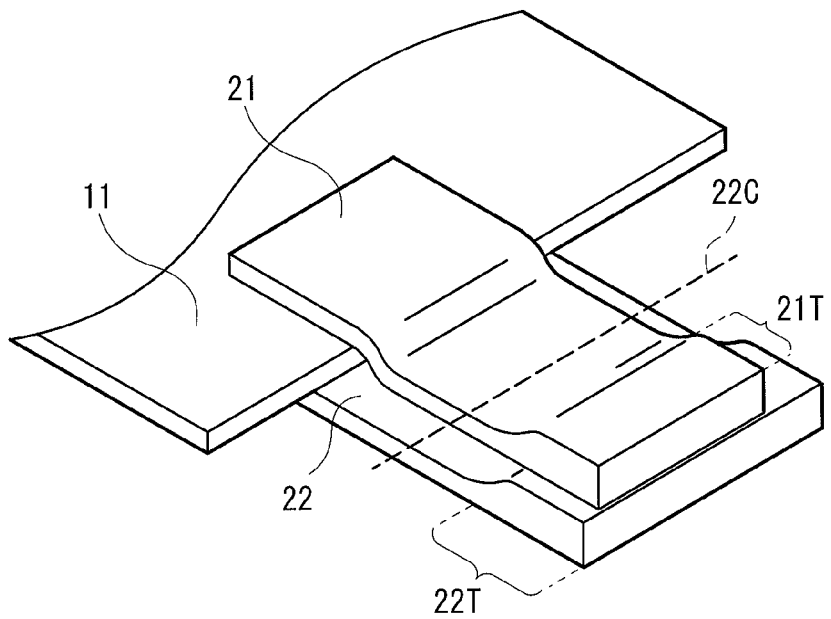
FIGS. 11A and 11B are perspective views illustrating other examples of the first wiring substrate and the second wiring substrate illustrated in FIG. 10.
Figure 11B:
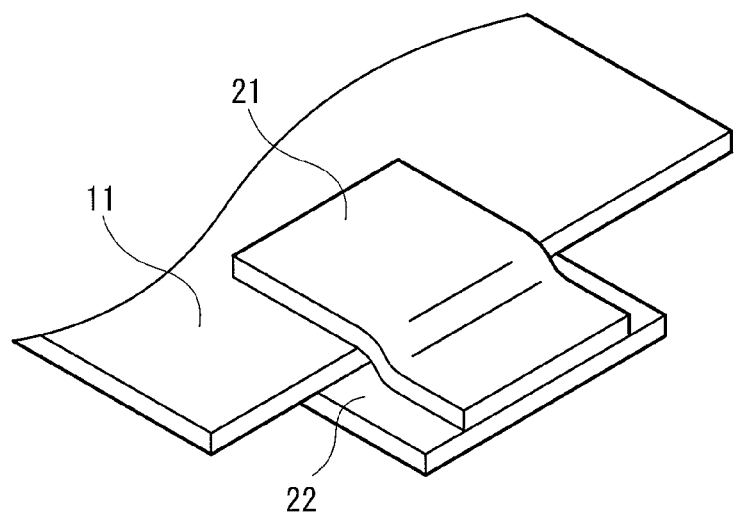

Moreover, as illustrated in FIG. 11A, a thick film portion (a thick film portion 21T) may be provided on the first wiring substrate 21, in addition to the second wiring substrate 22. The first wiring substrate 21 and the second wiring substrate 22 are provided with the thick film portions 21T and 22T, respectively, and are subjected to the thermal compression bonding, and then the thick film portions 21T and 22T are cut out along a cut line 22C. At this time, as illustrated in FIG. 11B, the end surface (the cut surface) of the first wiring substrate 21 and the end surface of the second wiring substrate 22 are aligned. Only the first wiring substrate 21 may have a thick film portion.

The display 1 illustrated in FIG. 1 is completed through the processes described above. Note that, after the device substrate 11 (the electrodes 12) and the second wiring substrate 22 are electrically connected to the first wiring substrate 21, the display layer 14 and the like may be formed.

In the display 1, the scan signal and the pixel signal are supplied from the scan line drive circuit 130 (the driver IC 23) and the signal line drive circuit 120, respectively, to each of the display devices 10, and the drive of the display devices 10 is accordingly controlled. Therefore, images are displayed on the counter substrate 15 side.

In the display 1 of the embodiment, the external signals (for example, the scan signal) are transmitted to the display devices 10 through the second wiring substrate 22 on the back surface of the device substrate 11 and the first wiring substrate 21 on the front surface of the device substrate 11. Specifically, since the wiring substrate is not folded, spring back does not occur in the first wiring substrate 21 and the second wiring substrate 22, and thus connection failure is prevented. The detail thereof is described in detail below.

Figure 12A:
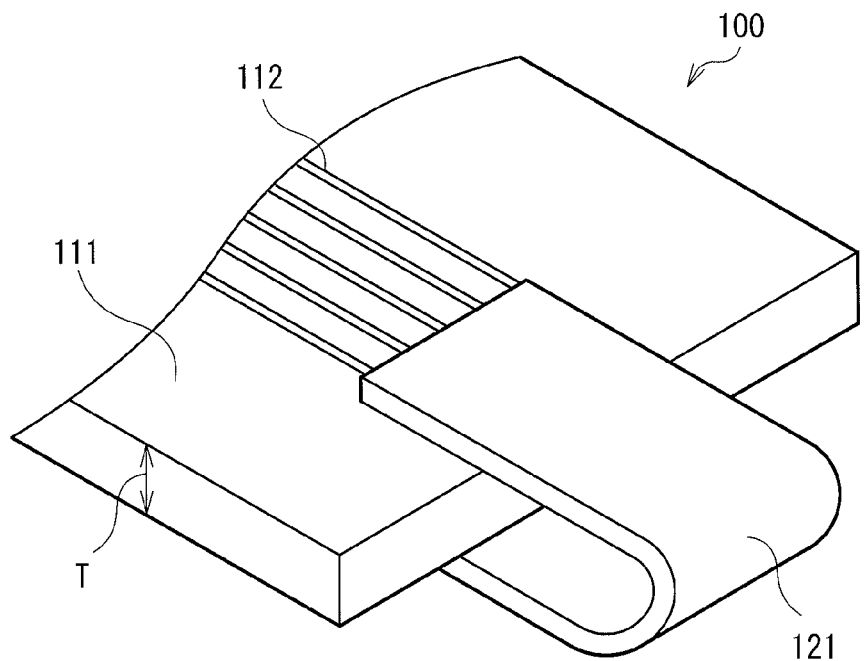
FIGS. 12A and 12B are perspective views each illustrating a state where a wiring substrate is connected to a device substrate in a related art.
Figure 12B:
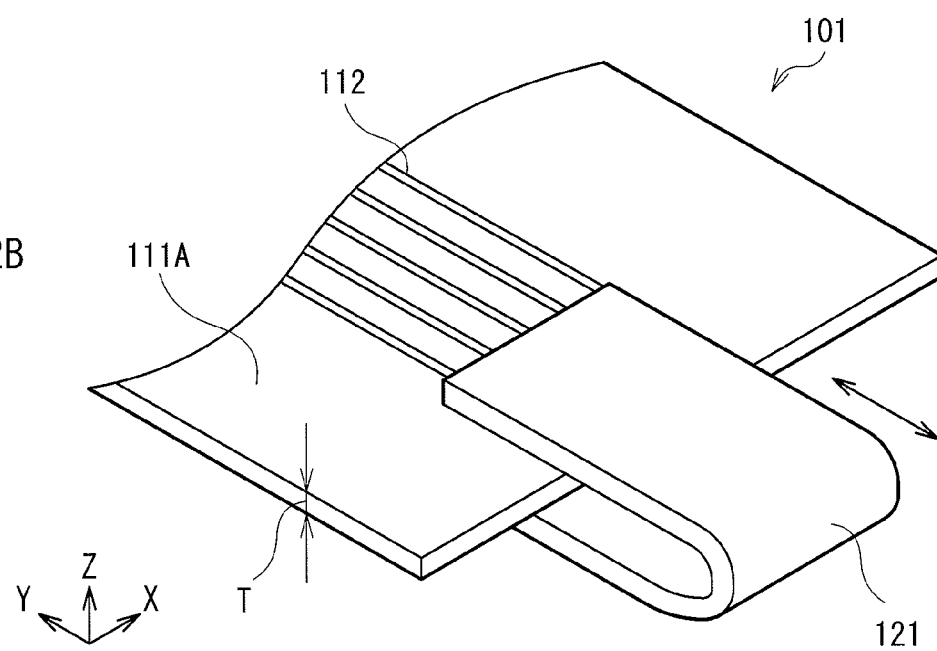

As illustrated in FIG. 12A, in a display (a display 100) in a related art, one wiring substrate (a wiring substrate 121) is folded along an outer shape of a device substrate (a device substrate 111), and electrodes 112 on the front surface of the device substrate 111 are connected to a drive circuit on the back surface. To reduce a frame width, the wiring substrate 121 is folded along a portion nearer the device substrate 111. In such a wiring substrate 121, stress (spring back) intended to restore the wiring substrate 121 from the folded state occurs. In the display 100, there is a possibility, due to the stress, of connection failure such as debonding (disconnection) between the device substrate 111 (the electrodes 112) and the wiring substrate 121, breaking or short circuit of the wirings of the wiring substrate 121. In particular, as illustrated in FIG. 12B, when a display (a display 101) is a flexible display, connection failure may easily occur. This is caused from the following reasons. In the display 100, a thickness T of the device substrate 111 is about 0.5 to about 0.7 mm. In contrast, in the display 101, a device substrate 111A has a thickness T smaller than that of the device substrate 111 by about single digit, or has the thickness T of about several tens µm. In other words, the thickness T of the device substrate 111A is substantially equal to the thickness of the wiring substrate 121, and curvature of the wiring substrate 121 is increased (a radius of curvature is close to zero). Accordingly, the spring back of the wiring substrate 121 is also increased.

In addition, the display 100 is protected by a housing thereof in use, and thus additional external force is not applied to the display 100. In contrast, the display 101 is subjected to pressure and is deformed in use. Therefore, in the display 101, the stress applied to the wiring substrate 121 is larger than that in the display 100.

Figure 13:
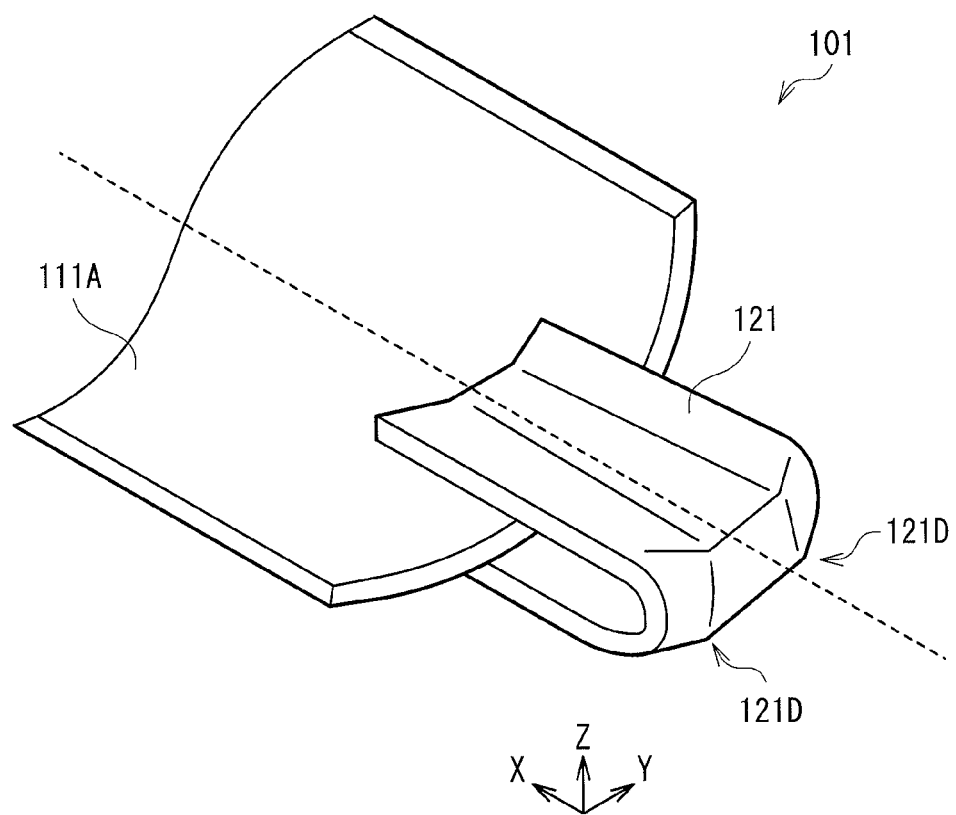
FIG. 13 is a perspective view illustrating a state where the wiring substrate and the device substrate illustrated in FIGS. 12A and 12B are warped.

Furthermore, as illustrated in FIG. 13, when the display 101 is warped along a dashed line (X-axis), for example, distortion (distortion 121D) may occur in the wiring substrate 121.

Figure 14A:
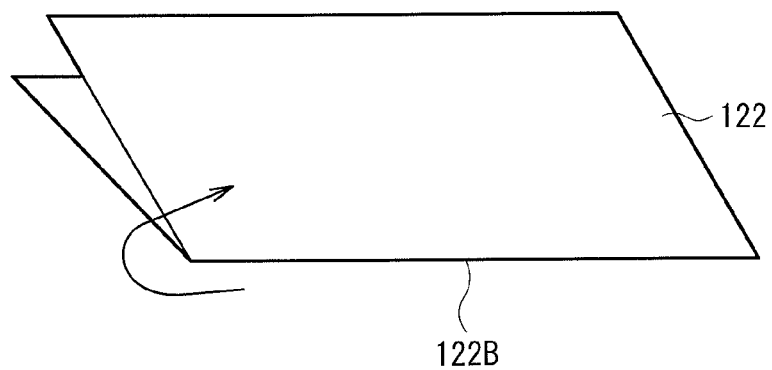
FIGS. 14A and 14B are perspective views for explaining an issue of the wiring substrate illustrated in FIG. 13.
Figure 14B:
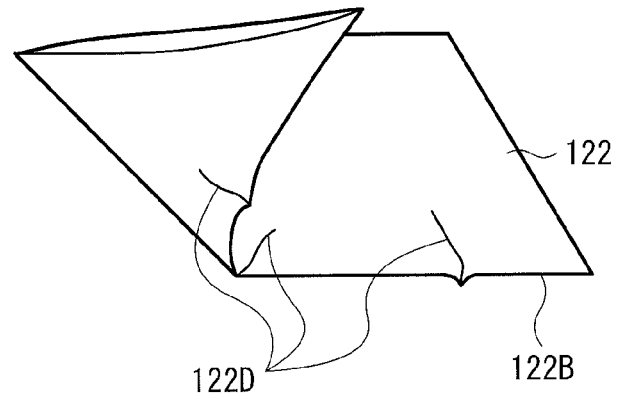

As illustrated in FIG. 14A, when a paper (a paper 122) folded along a folding portion 122B is warped in an arrow direction, distortion (distortion 122D) occurs (FIG. 14B). This is because force for expansion acts on the outside of the warped paper 122 and force for contraction acts on the inside thereof, and thus stress collects in the folding portion 122B of the paper 122 to cause the distortion 122D. The distortion 122D appears as, for example, unnatural bend which causes bending tendency. The distortion 122D is allowed to be reduced as the thickness of the paper 122 is reduced. However, if the thickness of the paper 122 is about several tens the distortion 122D is not allowed to be eliminated. The distortion 121D of the wiring substrate 121 occurs based on the similar principle to that of the distortion 122D of the paper 122, and the distortion 121D may cause breaking or short circuit of the wirings of the wiring substrate 121 or breaking of the base material. In addition, when the distortion 121D influences the connection portion between the device substrate 111A and the wiring substrate 121, these substrates may be detached.

In contrast, in the display 1 of the embodiment, the first wiring substrate 21 is provided on the front surface side of the device substrate 11 and the second wiring substrate 22 is provided on the back surface side. Therefore, the external signals are transmitted from the drive circuit (the driver IC 23) on the back surface side of the device substrate 11 to the display devices 10 on the front surface side without the wiring substrate being folded. Accordingly, spring back does not occur in the first wiring substrate 21 and the second wiring substrate 22, and thus connection failure is prevented. In particular, in the display 1 as a flexible display, although the device substrate 11 is thin and the external force is applied in use, connection failure is effectively suppressed.

Figure 15A:
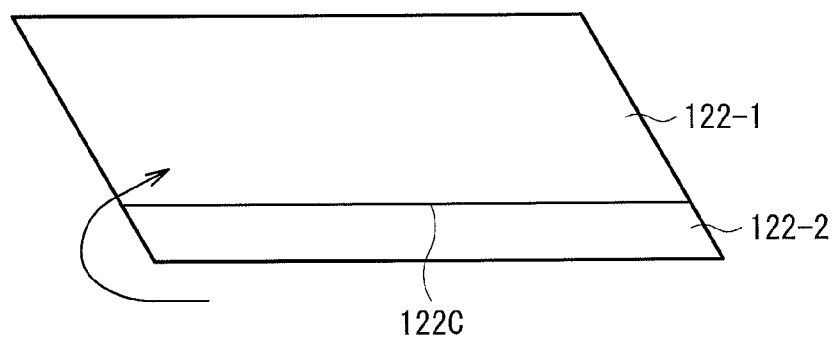
FIGS. 15A and 15B are perspective views for explaining a state where the display illustrated in FIG. 1 is warped.
Figure 15B:
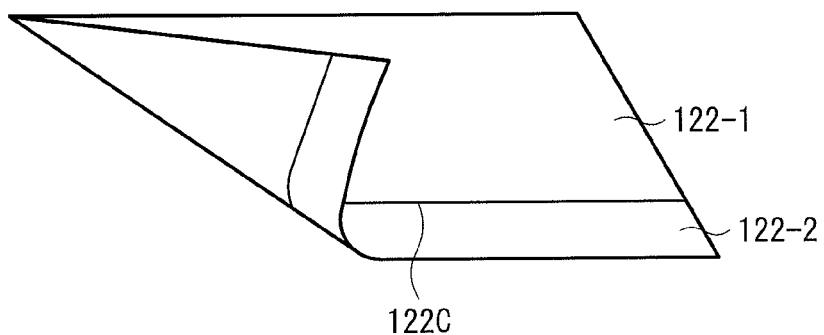

Furthermore, as illustrated in FIG. 15A, when two papers (papers 122-1 and 122-2) are bonded at a connection portion 122C and warped in an arrow direction, distortion does not occur (FIG. 15B). In other words, when the display 1 is warped in a similar way, distortion does not occur in the first wiring substrate 21 and the second wiring substrate 22, and thus connection failure caused by the distortion is allowed to be suppressed.

As described above, in the display 1 of the embodiment, the driver IC 23 and the display devices 10 are connected through the two wiring substrates (the first wiring substrate 21 and the second wiring substrate 22). Therefore, it is possible to prevent connection failure caused by the wiring substrates and to improve reliability. In particular, in the display 1 as a flexible display, connection failure is effectively suppressed.

Although modifications of the embodiment will be described below, like numerals are used to designate substantially like components of the above-described embodiment, and the description thereof will be appropriately omitted.

[Modification 1]

Figure 16:
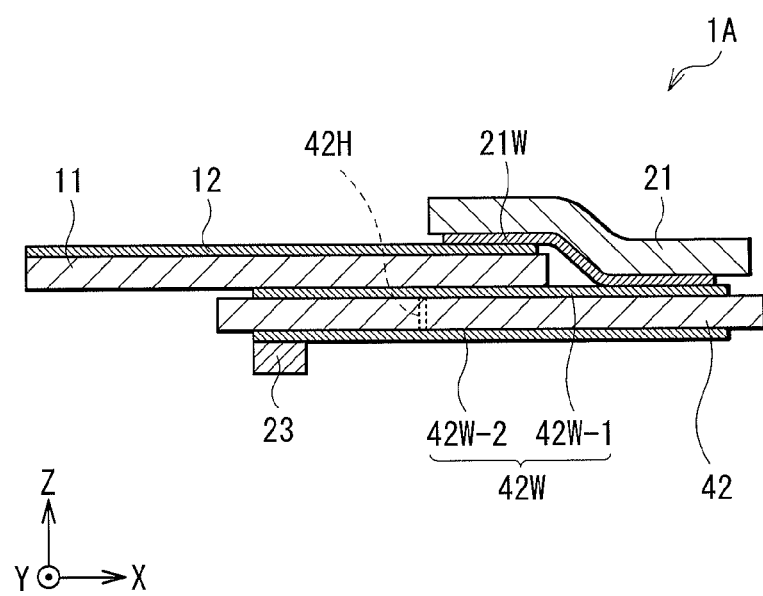
FIG. 16 is a sectional diagram illustrating a configuration of a main part of a display according to a modification 1.

FIG. 16 illustrates a cross-sectional configuration of a main part of a display (a display 1A) according to a modification 1 of the embodiment. The display 1A is provided with a second wiring substrate 42 having second wirings (second wirings 42W) on both surfaces thereof. In the second wiring substrate 42, one surface (surface facing the device substrate 11) is in contact with the first wiring substrate 21, and the other surface is mounted with the driver IC 23. Except for this point, the display 1A has the similar configuration to that of the display 1 of the embodiment, and the function and the effects of the display 1A are similar to those of the display 1.

The second wiring substrate 42 includes second wirings 42W-1 provided on one surface and second wirings 42W-2 provided on the other surface. The second wirings 42W-1 and 42W-2 are connected to each other through through-holes 42H provided on a base material of the second wiring substrate 42. In such a second wiring substrate 42, the driver IC 23 is allowed to be provided on a surface opposite to a surface contacted with the first wiring substrate 21 (on a surface facing the device substrate 11). In other words, a gap for the driver IC 23, between the device substrate 11 and the second wiring 42 is not necessary, and the second wiring substrate 42 is stably fixed to the device substrate 11. In addition, the device substrate 11 and the second wiring substrate 42 are closely bonded to improve flexibility of the display 1.

Moreover, provision of the second wirings 42W on both surfaces prevents curl of the second wiring substrate 42. When the wirings are provided on one surface of the wiring substrate, curl is likely to occur due to difference in coefficient of extension between one surface and the other surface. On the other hand, in the second wiring substrate 42, the second wirings 42W-1 and 42W-2 are provided on both surfaces. Therefore, the difference in coefficient of extension is decreased to prevent occurrence of curl.

[Modification 2]

Figure 17A:
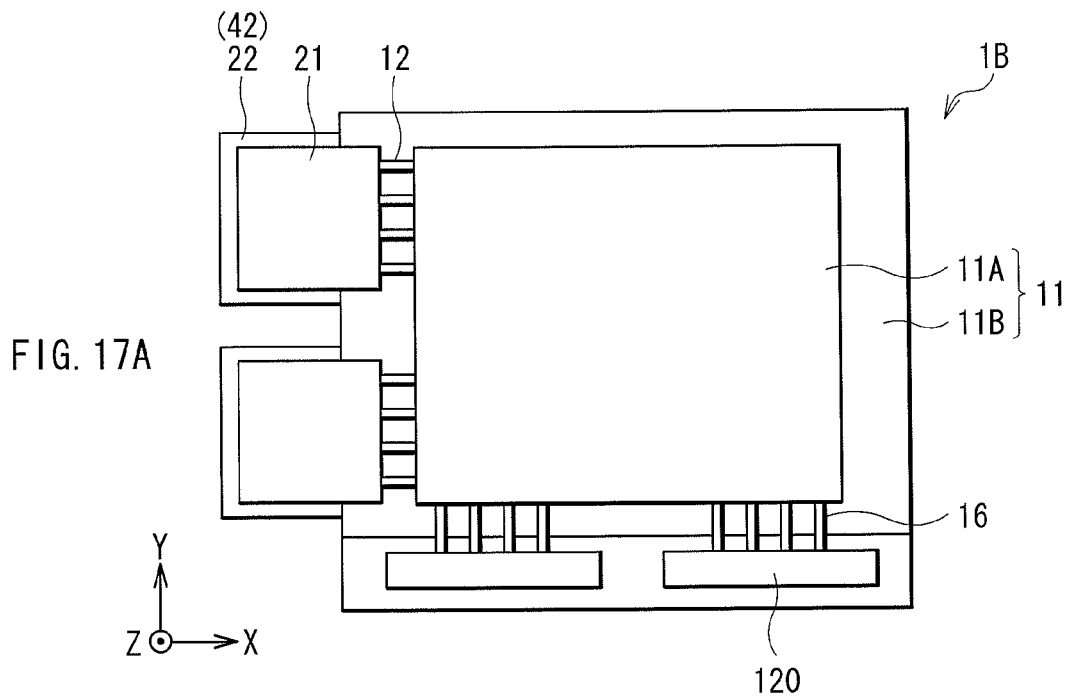
FIGS. 17A and 17B are plan views each illustrating a configuration of a main part of a display according to a modification 2.
Figure 17B:
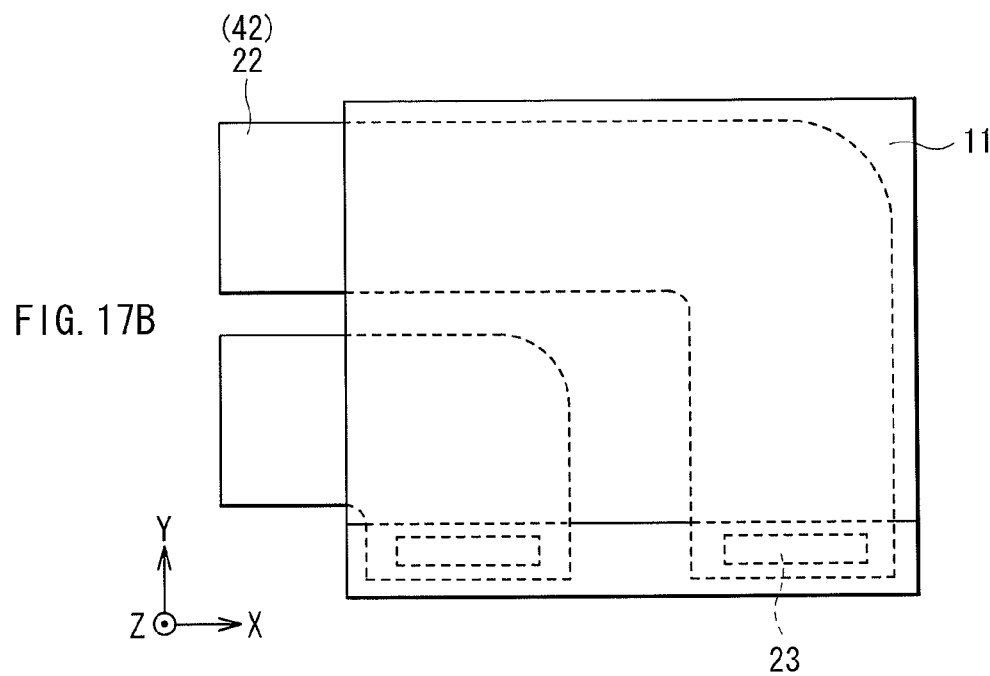

FIGS. 17A and 17B are top views each illustrating a planar configuration of a display (a display 1B) according to a modification 2 of the embodiment. FIG. 17A illustrates a front surface side of the display 1B, and FIG. 17B illustrates a back surface side thereof. In the display 1B, the signal line drive circuit 120 (the second drive circuit) and the driver IC 23 (the scan line drive circuit 130) are provided on the same side (a side in the X-axis direction) of the device substrate 11. Except for this point, the display 1B has the similar configuration to that of the display 1 of the embodiment, and the function and the effects of the display 1B are similar to those of the display 1.

In the display 1B, electrodes 16 on the device substrate 11 are drawn to a side (a first side) in the X-axis direction, and the electrodes 12 electrically connected to the driver IC 23 are drawn to a side (a second side) in the Y-axis direction. The electrode 16 applies a signal voltage from the signal line drive circuit 120 to the display devices 10 through the signal lines 120A. Similarly to the above-described display 1, the electrodes 12 are connected to the first wiring substrate 21, and the first wiring substrate 21 is connected to the second wiring substrate 22 (or the second wiring substrate 42). A region close to one end of the second wiring substrate 22 is in contact with the first wiring substrate 21 on the outside of the device substrate 11 (the second side), and a region close to the other end of the second wiring substrate 22 extends to the first side through the back surface side of the device substrate 11. The driver IC 23 is mounted in the region close to the other end of the second wiring substrate 22. In other words, the signal line drive circuit 120 and the driver IC 23 are provided on the first side of the device substrate 11. As described above, the second wiring substrate 22 extends on the back surface side of the device substrate 11, and the signal line drive circuit 120 and the driver IC 23 are provided on the same side of the device substrate 11 so that the number of movable directions of the device substrate 11 is increased and flexibility of the display 1 is improved. The second wiring substrate 22 may extend to the first side in a curved manner (FIG. 17B), or extend straightly.

The above-described display 1 (or the display 1A or 1B) is allowed to be mounted on electronic units illustrated in the following application examples 1 to 6, for example.

Application Example 1

Figure 18A:
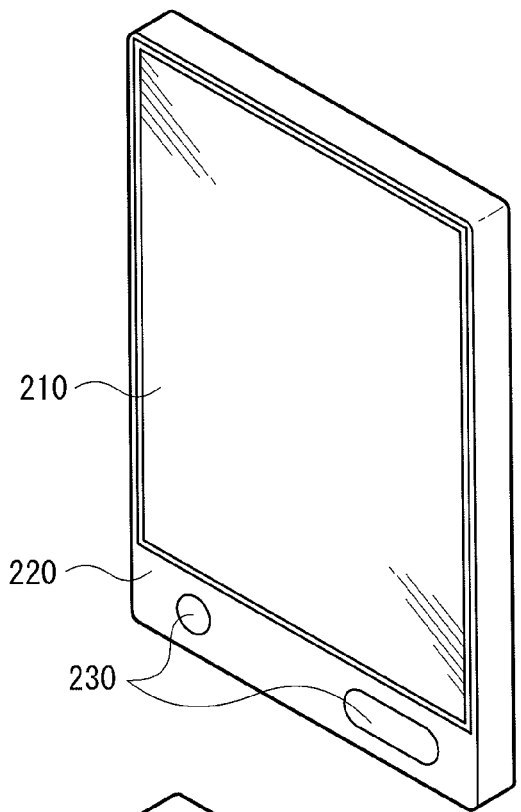
FIGS. 18A and 18B are perspective views each illustrating an appearance of an application example 1.
Figure 18B:
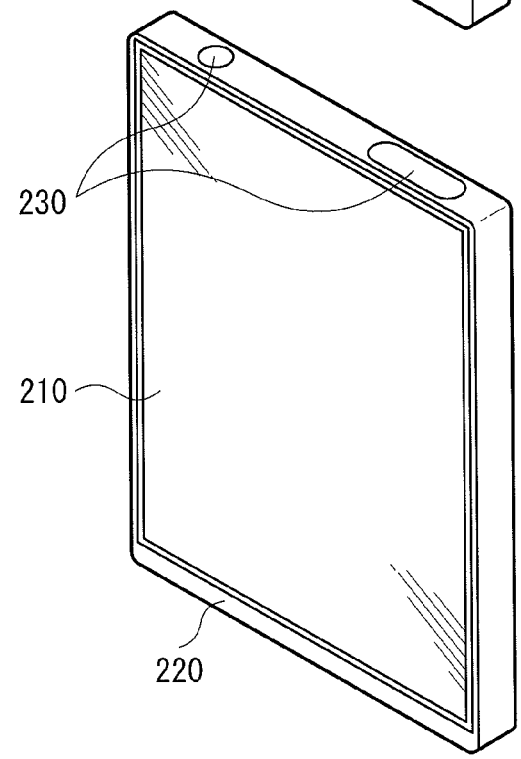

FIGS. 18A and 18B each illustrate an appearance of an electronic book. The electronic book includes, for example, a display section 210, a non-display section 220, and an operation section 230, and the display section 210 is configured of the above-descried display 1, 1A, or 1B. The operation section 230 may be formed on the same surface (a front surface) as that of the display section 210 as illustrated in FIG. 18A, or may be formed on a surface (a top surface) different from that of the display section 210 as illustrated in FIG. 18B.

Application Example 2

Figure 19:
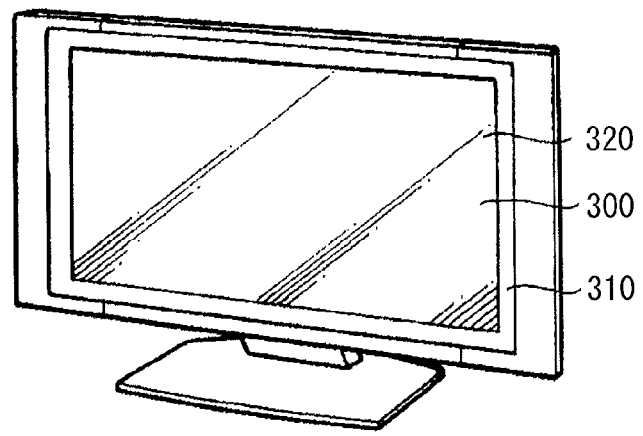
FIG. 19 is a perspective view illustrating an appearance of an application example 2.

FIG. 19 illustrates an appearance of a television. The television includes, for example, an image display screen section 300 including a front panel 310 and a color filter 320. The image display screen section 300 is configured of the above-described display 1, 1A, or 1B.

Application Example 3

Figure 20A:
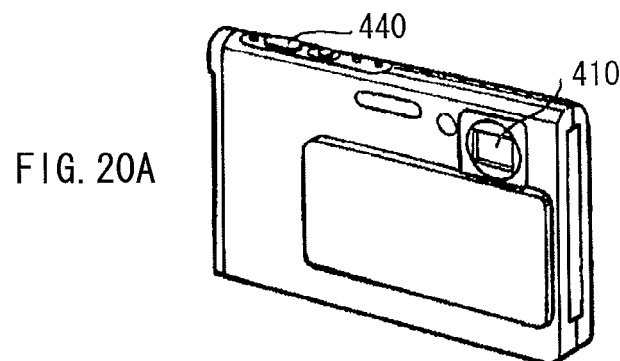
FIG. 20A is a perspective view illustrating an appearance of an application example 3 viewed from a front side thereof.
Figure 20B:
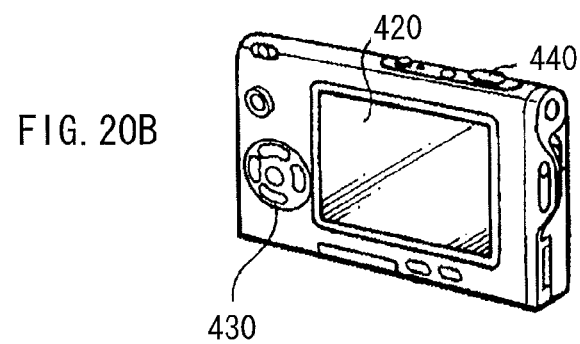
FIG. 20B is a perspective view illustrating an appearance of the application example 3 viewed from a back side thereof.

FIGS. 20A and 20B each illustrate an appearance of a digital still camera. The digital still camera includes, for example, a light emitting section 410 for flash light, a display section 420, a menu switch 430, and a shutter button 440. The display section 420 is configured of the above-described display 1, 1A, or 1B.

Application Example 4

Figure 21:
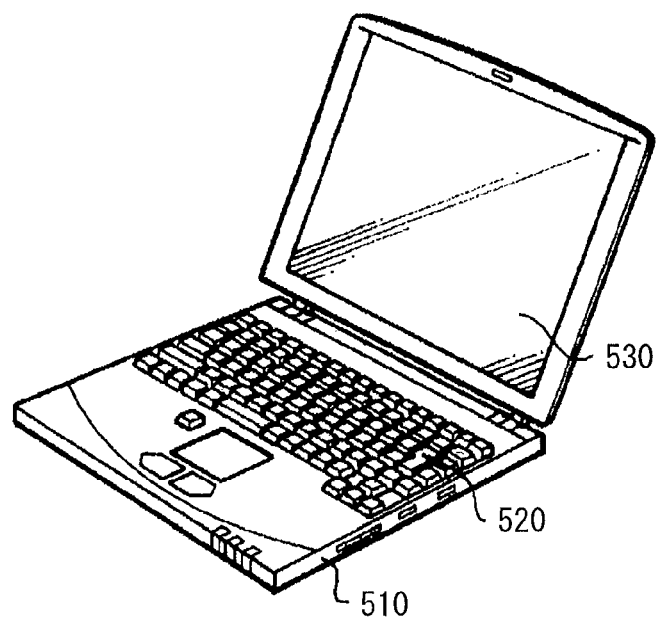
FIG. 21 is a perspective view illustrating an appearance of an application example 4.

FIG. 21 illustrates an appearance of a notebook personal computer. The notebook personal computer includes, for example, a main body 510, a keyboard 520 for inputting letters and the like, and a display section 530 displaying images. The display section 530 is configured of the above-described display 1, 1A, or 1B.

Application Example 5

Figure 22:
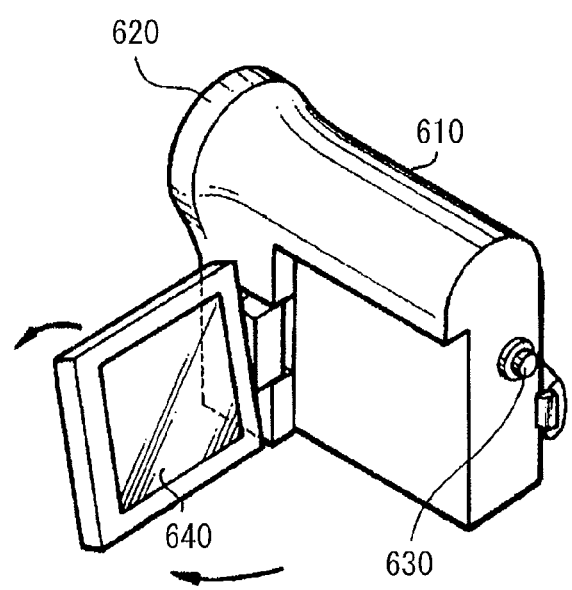
FIG. 22 is a perspective view illustrating an appearance of an application example 5.

FIG. 22 illustrates an appearance of a video camera. The video camera includes, for example, a main body section 610, a lens 620 for shooting an object, provided on a front side surface of the main body section 610, a shooting start-stop switch 630, and a display section 640. The display section 640 is configured of the above-described display 1, 1A, or 1B.

Application Example 6

FIGS. 23A to 23G each illustrate an appearance of a mobile phone. The mobile phone is configured by connecting, for example, an upper housing 710 and a lower housing 720 with a connecting section (a hinge section) 730, and includes a display 740, a sub display 750, a picture light 760, and a camera 770. The display 740 and/or the sub display 750 are/is configured of the above-described display 1, 1A, or 1B.

Hereinbefore, although the technology has been described with referring to the embodiment and the modifications, the technology is not limited to the above-described embodiment and the like, and various modifications may be made. For example, in the above-described embodiment and the like, the case where the driver IC 23 is the scan line drive circuit 130 has been described. However, the driver IC 23 may be the signal line drive circuit 120. At this time, for example, the electrodes 12 are electrically connected to one of the source-drain electrodes of the selection TFTs 52A through the signal lines 120A. In addition, as the other modifications, the electrodes 12 may be connected to the other wirings (terminals) such as power lines (not illustrated), or a plurality of electrodes 12 each connected to different wirings (for example, the scan line 130A and the signal line 120A, the scan line 130A and the power line, or the signal line 120A and the power line) are provided and combined. Further, the second wiring substrate 22 (the second wiring substrate 42) may be electrically connected to the other electronic circuits, instead of the driver IC 23.

Furthermore, in the above-described embodiment and the like, the case where the pixel drive circuit 150 includes two TFTs (the selection TFTs 13A and the drive TFTs 13B) has been described (FIG. 3).

Alternatively, one display device 10 may include one or three or more TFTs. Moreover, the display 1 may display images on the device substrate 11 side.

In addition, in the above-described modification 1, the case where the through-holes 42H are provided on the second wiring substrate 42 has been described. Alternatively, through-holes may be provided on the first wiring substrate 21.

Moreover, in the above-described embodiment and the like, the case where the width of the second wiring substrate 22 is larger than the width of the first wiring substrate 21 has been illustrated (FIG. 1 and the like). Alternatively, the first wiring substrate 21 and the second wiring substrate 22 may have the same width, or the width of the first wiring substrate 21 may be larger than the width of the second wiring substrate 22.

Furthermore, in the above-described embodiment and the like, the case where the end surface of the second wiring substrate 22 is located on the outer side of the device substrate 11 than that of the first wiring substrate 21 has been illustrated (FIG. 1 and the like). Alternatively, the end surfaces of the first wiring substrate 21 and the second wiring substrate 22 may be aligned, or the end surface of the first wiring substrate 21 is located on outer side of the device substrate 11.

In addition, in the above-described embodiment and the like, the case where the device substrate 11, the first wiring substrate 21, and the second wiring substrate 22 each have a rectangular shape has been illustrated (FIG. 1 and the like). Alternatively, the substrates may have the other shapes such as a square shape and a trapezoidal shape.

Moreover, the material and the thickness of each of the parts described in the above-described embodiment and the like, the formation method, or the like are not limited, and the other materials and the other thickness, or the other formation methods are acceptable.

Furthermore, in the above-described embodiment and the like, the case where the semiconductor unit includes the display devices as the functional devices has been described. Alternatively, the functional devices other than the display device, for example, an image pickup device and a solar cell are acceptable.

Note that the present technology may be configured as follows.

(1) A semiconductor unit including:
 a device substrate including a functional device and an electrode;
 a first wiring substrate electrically connected to the functional device through the electrode; and
 a second wiring substrate electrically connected to the functional device through the first wiring substrate.
(2) The semiconductor unit according to (1), wherein
 the electrode of the device substrate is in contact with a first wiring of the first wiring substrate, and
 the first wiring is in contact with a second wiring of the second wiring substrate.
(3) The semiconductor unit according to (1) or (2), wherein
 the functional device and the electrode are provided on a first surface of the device substrate, and
 the first wiring substrate is provided on a first surface side of the device substrate, and the second wiring substrate is provided on a second surface side opposing to the first surface.
(4) The semiconductor unit according to any one of (1) to (3), wherein the first wiring substrate and the second wiring substrate are in contact with each other on an outside of the device substrate.
(5) The semiconductor unit according to any one of (1) to (4), wherein each of the first wiring substrate and the second wiring substrate is configured of a flexible material.
(6) The semiconductor unit according to any one of (1) to (5), wherein the second wiring substrate is connected to a first drive circuit transmitting external signals.
(7) The semiconductor unit according to (6), wherein
 a second wiring is provided on both of a first surface and a second surface of the second wiring substrate, the first surface facing a first wiring of the first wiring substrate, and
 the first drive circuit is connected to the second surface of the second wiring substrate.
(8) The semiconductor unit according to (7), wherein the second wiring on the first surface of the second wiring substrate is connected to the second wiring on the second surface of the second wiring substrate through through-holes provided on the second wiring substrate.
(9) The semiconductor unit according to any one of (1) to (8), wherein the device substrate is configured of a flexible material.
(10) The semiconductor unit according to any one of (1) to (9), wherein
 the device substrate includes a first surface, a second surface, and a third surface, the second surface opposing to the first surface, the third surface connecting the first surface and the second surface, the first wiring substrate is provided from the first surface to the third surface of the device substrate and has a protective portion partially covering the first wiring, and the protective portion faces a corner configured of the first surface and the third surface of the device substrate.

(11) The semiconductor unit according to any one of (6) to (10), wherein a second drive circuit is provided on one side of the device substrate, the second drive circuit driving the functional device, a region close to one end of the second wiring substrate is in contact with the first wiring substrate on the outside of the device substrate, and a region close to the other end of the second wiring substrate extends to the one side of the device substrate provided with the second drive circuit, and the first drive circuit is connected to the region close to the other end of the second wiring substrate.

(12) The semiconductor unit according to any one of (1) to (11), wherein end surfaces of the first wiring substrate and the second wiring substrate are aligned.

(13) The semiconductor unit according to any one of (1) to (12), wherein the functional device is a display device.

(14) The semiconductor unit according to any one of (6) to (13), wherein the first drive circuit is a driver integrated circuit (IC).

(15) An electronic apparatus with a semiconductor unit, the semiconductor unit including:

a device substrate including a functional device and an electrode;

a first wiring substrate electrically connected to the functional device through the electrode; and a second wiring substrate electrically connected to the functional device through the first wiring substrate.

(16) A method of manufacturing a semiconductor unit, the method including:

forming a device substrate including a functional device and an electrode, the electrode being electrically connected to the functional device; and electrically connecting a first wiring substrate to the electrode and to a second wiring substrate.

(17) The method according to (16), wherein the first wiring substrate is electrically connected to the electrode and to the second wiring substrate after a thick film portion is provided an end of one or both of the second wiring substrate and the first wiring substrate.

(18) The method according to (17), wherein the thick film portion is cut out after the first wiring substrate is electrically connected to the electrode and to the second wiring substrate.

(19) The method according to any one of (16) to (18), wherein electrical connection between the first wiring substrate and the electrode and electrical connection between the first wiring substrate and the second wiring substrate are performed at a time.

(20) The method according to any one of (16) to (18), wherein the electrical connection between the first wiring substrate and the second wiring substrate is performed after electrical connection between the first wiring substrate and the electrode is performed.

The present application contains subject matter related to that disclosed in Japanese Priority Patent Application JP 2012-023315 filed in the Japan Patent Office on Feb. 6, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor unit, comprising:
   a device substrate including a functional device and an electrode;
   a first wiring substrate electrically connected to the functional device through the electrode; and
   a second wiring substrate electrically connected to the functional device through the first wiring substrate, wherein the second wiring substrate is connected to a first drive circuit transmitting external signals.

2. The semiconductor unit according to claim 1, wherein the electrode of the device substrate is in contact with a first wiring of the first wiring substrate, and
   the first wiring is in contact with a second wiring of the second wiring substrate.

3. The semiconductor unit according to claim 1, wherein the functional device and the electrode are provided on a first surface of the device substrate, and
   the first wiring substrate is provided on a first surface side of the device substrate, and the second wiring substrate is provided on a second surface side opposing to the first surface.

4. The semiconductor unit according to claim 1, wherein the first wiring substrate and the second wiring substrate are in contact with each other on an outside of the device substrate.

5. The semiconductor unit according to claim 1, wherein each of the first wiring substrate and the second wiring substrate is configured of a flexible material.

6. The semiconductor unit according to claim 1, wherein
   a second wiring is provided on both of a first surface and a second surface of the second wiring substrate, the first surface facing a first wiring of the first wiring substrate, and
   the first drive circuit is connected to the second surface of the second wiring substrate.

7. The semiconductor unit according to claim 6, wherein the second wiring on the first surface of the second wiring substrate is connected to the second wiring on the second surface of the second wiring substrate through through-holes provided on the second wiring substrate.

8. The semiconductor unit according to claim 1, wherein
   a second drive circuit is provided on one side of the device substrate, the second drive circuit driving the functional device,
   a region close to a first end of the second wiring substrate is in contact with the first wiring substrate on an outside of the device substrate, and a region close to a second end of the second wiring substrate extends to the one side of the device substrate provided with the second drive circuit, and
   the first drive circuit is connected to the region close to the second end of the second wiring substrate.

9. The semiconductor unit according to claim 1, wherein the functional device is a display device.

10. The semiconductor unit according to claim 1, wherein the first drive circuit is a driver integrated circuit (IC).

11. A semiconductor unit, comprising:
    a device substrate including a functional device and an electrode;
    a first wiring substrate electrically connected to the functional device through the electrode; and a second wiring substrate electrically connected to the functional device through the first wiring substrate, wherein the device substrate is configured of a flexible material.

12. The semiconductor unit according to claim 11, wherein
the electrode of the device substrate is in contact with a first wiring of the first wiring substrate, and
the first wiring is in contact with a second wiring of the second wiring substrate.

13. The semiconductor unit according to claim 11, wherein
the functional device and the electrode are provided on a first surface of the device substrate, and
the first wiring substrate is provided on a first surface side of the device substrate, and the second wiring substrate is provided on a second surface side opposing to the first surface.

14. The semiconductor unit according to claim 11, wherein the first wiring substrate and the second wiring substrate are in contact with each other on an outside of the device substrate.

15. A semiconductor unit, comprising:
a device substrate including a functional device and an electrode;
a first wiring substrate electrically connected to the functional device through the electrode; and
a second wiring substrate electrically connected to the functional device through the first wiring substrate,
wherein each of the first wiring substrate and the second wiring substrate is configured of a flexible material,
wherein the device substrate includes a first surface, a second surface, and a third surface, the second surface opposing to the first surface, the third surface connecting the first surface and the second surface,
wherein the first wiring substrate is provided from the first surface to the third surface of the device substrate and has a protective portion partially covering the first wiring substrate, and
wherein the protective portion faces a corner configured of the first surface and the third surface of the device substrate.

16. A semiconductor unit, comprising:
a device substrate including a functional device and an electrode;
a first wiring substrate electrically connected to the functional device through the electrode; and
a second wiring substrate electrically connected to the functional device through the first wiring substrate,
wherein end surfaces of the first wiring substrate and the second wiring substrate are aligned.

17. A method of manufacturing a semiconductor unit, the method comprising:
forming a device substrate including a functional device and an electrode, the electrode being electrically connected to the functional device; and
electrically connecting a first wiring substrate to the electrode and to a second wiring substrate, wherein the first wiring substrate is electrically connected to the electrode and to the second wiring substrate after a thick film portion is provided an end of one or both of the second wiring substrate and the first wiring substrate.

18. The method according to claim 17, wherein the thick film portion is cut out after the first wiring substrate is electrically connected to the electrode and to the second wiring substrate.

19. A method of manufacturing a semiconductor unit, the method comprising:
forming a device substrate including a functional device and an electrode, the electrode being electrically connected to the functional device; and
electrically connecting a first wiring substrate to the electrode and to a second wiring substrate, wherein the electrical connection between the first wiring substrate and the electrode and the electrical connection between the first wiring substrate and the second wiring substrate are performed at a same time.

20. A method of manufacturing a semiconductor unit, the method comprising:
forming a device substrate including a functional device and an electrode, wherein the electrode is electrically connected to the functional device; and
electrically connecting a first wiring substrate to the electrode and to a second wiring substrate, wherein the electrical connection between the first wiring substrate and the second wiring substrate is performed after the electrical connection between the first wiring substrate and the electrode is performed.

\* \* \* \* \*